United States Patent

Noakes et al.

[11] Patent Number: 5,847,578
[45] Date of Patent: Dec. 8, 1998

[54] PROGRAMMABLE MULTIPLEXING INPUT/OUTPUT PORT

[75] Inventors: Michael Donald Noakes, Somerville; Charles W. Selvidge, Charlestown; Anant Argarwal, Framingham, all of Mass.; Jonathan Babb, Ringgold, Ga.; Matthew L. Dahl, Marlborough, Mass.

[73] Assignee: Virtual Machine Works, Cambridge, Mass.

[21] Appl. No.: 780,527

[22] Filed: Jan. 8, 1997

Related U.S. Application Data

[63] Continuation of Ser. No. 333,131, Nov. 1, 1994, abandoned.
[51] Int. Cl.$^6$ .............................. H03K 7/38; H03K 19/00
[52] U.S. Cl. .................................. 326/39; 326/41; 326/93
[58] Field of Search ................................. 326/38, 39, 40, 326/41, 46, 193; 370/535, 537, 542; 327/407, 415

[56] References Cited

U.S. PATENT DOCUMENTS

| | | | |
|---|---|---|---|
| 4,495,590 | 1/1985 | Mitchell, Jr. | 326/39 |
| 4,718,063 | 1/1988 | Reedy et al. | 327/403 |
| 4,926,423 | 5/1990 | Zukowski | 327/407 |
| 5,111,455 | 5/1992 | Negus | 327/407 |
| 5,136,188 | 8/1992 | Ha et al. | 326/39 |
| 5,144,166 | 9/1992 | Camarota et al. | 326/41 |
| 5,231,636 | 7/1993 | Rasmussen | 327/407 |
| 5,317,210 | 5/1994 | Patel | 326/41 |
| 5,371,422 | 12/1994 | Patel et al. | 326/41 |
| 5,402,014 | 3/1995 | Ziklik et al. | 326/37 |
| 5,526,360 | 6/1996 | Kraft | 327/407 |
| 5,561,773 | 10/1996 | Kalish et al. | 326/40 |
| 5,583,450 | 12/1996 | Trimberger et al. | 326/40 |
| 5,621,650 | 4/1997 | Agrawal et al. | 326/41 |
| 5,659,716 | 8/1997 | Selvidge et al. | 326/41 |
| 5,671,432 | 9/1997 | Bertolet et al. | 326/56 |
| 5,717,695 | 2/1998 | Manela et al. | 326/39 |

OTHER PUBLICATIONS

Wakerly, John F., "Digital Design, Principles and Practices", copyright 1989 by John F. Wakerly, pp. 466–475, Sep. 1989.

*Primary Examiner*—Jon Santamauro
*Assistant Examiner*—Richard Roseen

[57] ABSTRACT

A programmable logic circuit includes a programmable logic array which generates a plurality of output signals for output from a single port on the programmable logic circuit, and which processes a plurality of input signals received from a single port on the programmable logic circuit. The programmable logic circuit also includes multiplexing means for receiving the plurality of output signals generated by the programmable logic array and for multiplexing the plurality of output signals. An output port outputs, from the programmable logic circuit, the multiplexed plurality of output signals generated by the programmable logic array. An input port receives a multiplexed plurality of input signals, and a demultiplexing means demultiplexes the multiplexed plurality of input signals and configurably communicates the demultiplexed plurality of input signals to the programmable logic array. This demultiplexing means and the multiplexing means are each operable at a clock speed which is different from a clock speed of the programmable logic array.

31 Claims, 9 Drawing Sheets

PROGRAMMABLE MULTIPLEXING INPUT/ OUTPUT PORT

This application is a continuation of application No. 08/333,131, filed Nov. 1, 1994, now abandoned.

BACKGROUND OF THE INVENTION

The present invention relates to multiplexing input/output ports for use on field programmable gate arrays and other devices with programmable hardware. The invention uses time-domain multiplexing, a technique involving the sequential transmission of a collection of values over a single wire or channel.

Field programmable gate arrays (FPGA) such as those manufactured by Altera (San Jose, Calif.), ATT (Allentown, Pa.) or Xilinx (San Jose, Calif.) are integrated circuits which contain arrays of user configurable logic gates. FPGAs consist of a central core of configurable logic surrounded by programmable input/output ports, see for, for example Trimberger, *Field-Programmable Gate Array Technology*, Kluwer Academic Press, 1994. The logic array and input/output ports are externally customizable, such that an FPGA can function, within the physical limits of the logic array and input/output ports, as an arbitrary logic circuit.

Large digital logic circuits can be implemented using an interconnected collection of FPGAs. The circuit is partitioned such that each FPGA is configured (programmed) to implement a specific portion of the logic circuit. Through the FPGA interconnections, each FPGA is able to communicate with other FPGAs so as to convey logical values (signals) to the rest of the circuit partitions. Thus, working in concert, the interconnected FPGAs are able to implement the entire circuit. Logic emulation is an example application in which large circuits are implemented with a collection of FPGAs.

In order for an implemented circuit to properly function, the partitioning of the circuit must take into account not only the size of the logic array of each FPGA, but also the number of input/output ports. The size of the logic array limits the computational resources available in a particular FPGA. The finite number of input/output ports limits the communication resources available in a particular FPGA. These finite resources typically limit the efficient utilization of the FPGA.

In a partitioned circuit, each partition contains a certain number of signals requiring communication to other partitions. Prior systems of interconnected FPGAs would assign each of these signals to an individual input/output port. This partitioning scheme results in a partition that is typically input/output port limited. Therefore, utilizing this scheme, the determining factor in the number of FPGAs required to implement a particular circuit is the number of input/output ports available for communication. This results in inefficient utilization of the individual FPGA core logic array.

In addition, the functions performed by a programmed core logic array typically run slower than the potential rate of the input/output ports. Communications bandwidth is wasted as the input/output ports wait for logical values to be computed by the central core. This mismatch between the speed of the core logic array and the input/output ports also represents inefficient utilization of the FPGA.

Therefore, it is a goal of the present invention to improve communications bandwidth between logic circuits. It is a further goal of the invention to provide a more flexible input/output port for logic circuits. In addition, it is a goal of the present invention to provide these functions without utilizing a portion of the underlying logic array of the logic circuit.

SUMMARY OF THE INVENTION

The present invention discloses an input/output buffer design for FPGAs and other programmable devices. An output buffer of the present invention multiplexes a selection of internal signals onto a single wire. An input buffer of the present invention demultiplexes such signals for utilization within the programmable device.

A multiplexing output buffer comprises a means for selecting a portion of the internal device signals for multiplexing, a multiplexor and a buffer for driving the multiplexed signals onto the device pin. The control logic for the multiplexor may be either internal or external to the programmable device. If the control is internal, it may be created either by the programmable logic array or by dedicated hardware.

A multiplexing input buffer comprises an input buffer for receiving the multiplexed signal from the pin, a demultiplexor and means for driving the demultiplexed signals into the programmable device. The control logic for the demultiplexor may be either internal or external to the programmable device. If the control is internal, it may be created either by the programmable logic array or by dedicated hardware.

A buffer hardware may comprise either a multiplexing input buffer, a multiplexing output buffer or both. In addition, the buffer hardware may also comprise the conventional programmable pin circuit of the underlying programmable device. The device is then programmed to select the proper buffer form.

BRIEF DESCRIPTION OF THE DRAWINGS

The present invention will be better understood from the following detailed description when read with reference to the following drawings in which.

DETAILED DESCRIPTION OF THE PREFERRED EMBODIMENT

Figure 1:
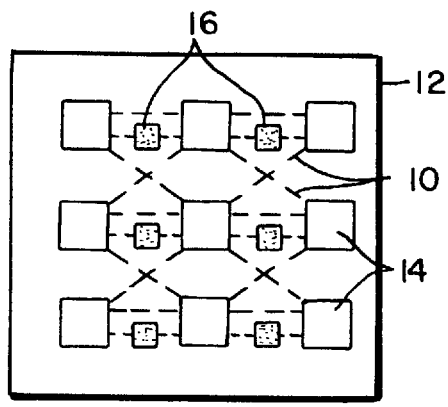
FIG. 1 is a block diagram illustrating a prior art collection of interconnected FPGAs.

A system comprising a collection of FPGAs implementing a logic circuit design is illustrated in FIG. 1. The FPGA system 12 is an array of interconnected FPGAs 14 with possibly the addition of other elements (i.e. memory) 16. The FPGA system 12 utilizes communications paths 10 for internal FPGA to FPGA communication.

Figure 2:
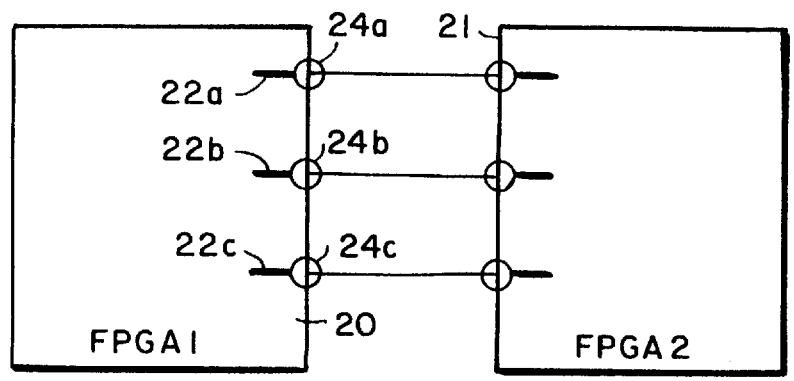
FIG. 2 is a block diagram of a prior art direct hardwire interconnect for a connected pair of FPGAs.

Prior non-multiplexing versions of FPGA circuit implementations, as illustrated by FIG. 2, partition a circuit such that a portion of the circuit is implemented by individual FPGAs 20 and 21. Each partition contains a certain number of signals 22a, 22b, and 22c requiring communication to other partitions. Each of these communicated signals 22a, 22b, and 22c is thus assigned an individual input/output port 24a, 24b, 24c. As input/output ports are finite in number, this partitioning scheme typically results in partitions that are input/output port limited, rather than logic array limited. Therefore, the limiting factor in the size of a circuit partition implemented in a particular FPGA is the number of input/output ports available for communication. As a result, the FPGA resources (i.e. logic array) are not fully and efficiently utilized.

Figure 3:
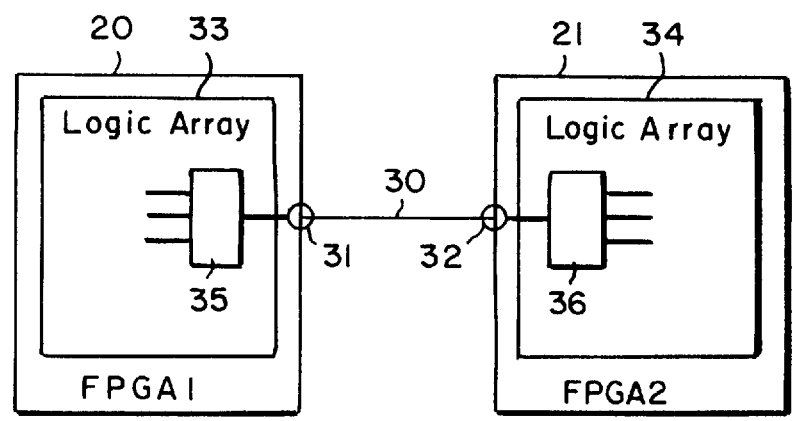
FIG. 3 is a block diagram of a prior art interconnect design utilizing the logic arrays of FPGAs.

One solution to this problem, as illustrate in FIG. 3, is to share an input/output wire 30 amongst a variety of signals. This can be accomplished by multiplexing/demultiplexing the input/output ports 31 and 32 as illustrated in FIG. 3. Implementation of this multiplexing/demultiplexing scheme within existing FPGAs 20 and 21 would require the allocation of a portion of the logic arrays 33 and 34 in the creation of the multiplexors 35 and 36.

The allocation of logic gates within the logic array for the creation of the multiplexors/demultiplexors leaves less of the array available as a computation resource. In addition, this solution uses the same clock as that of the underlying logic array, which limits the communication bandwidth. Therefore, while this solution utilizes fewer input/output ports, it comes with an associated cost.

The present invention discloses various hardware FPGA pin-multiplexing techniques that tradeoff between speed, space, and complexity of use. The invention involves replacing the input/output buffers (ports) on some or all of the FPGA pins with special multiplexing input/output buffers which synchronously transmit multiple bits of data using a clock which is potentially faster that the clock(s) used within the logic in the reprogrammable FPGA logic array core.

Virtual Pins Abstraction

The virtual pins abstraction of the present invention is a simplified behavioral model for time-domain, multiplexed FPGA pins. In this model, a MultiPin is defined as an FPGA pin which will be multiplexed. L is defined as the level of multiplexing of a MultiPin, the number of bits which are transmitted via this pin during the period of the FPGA core clock.

Figure 4:
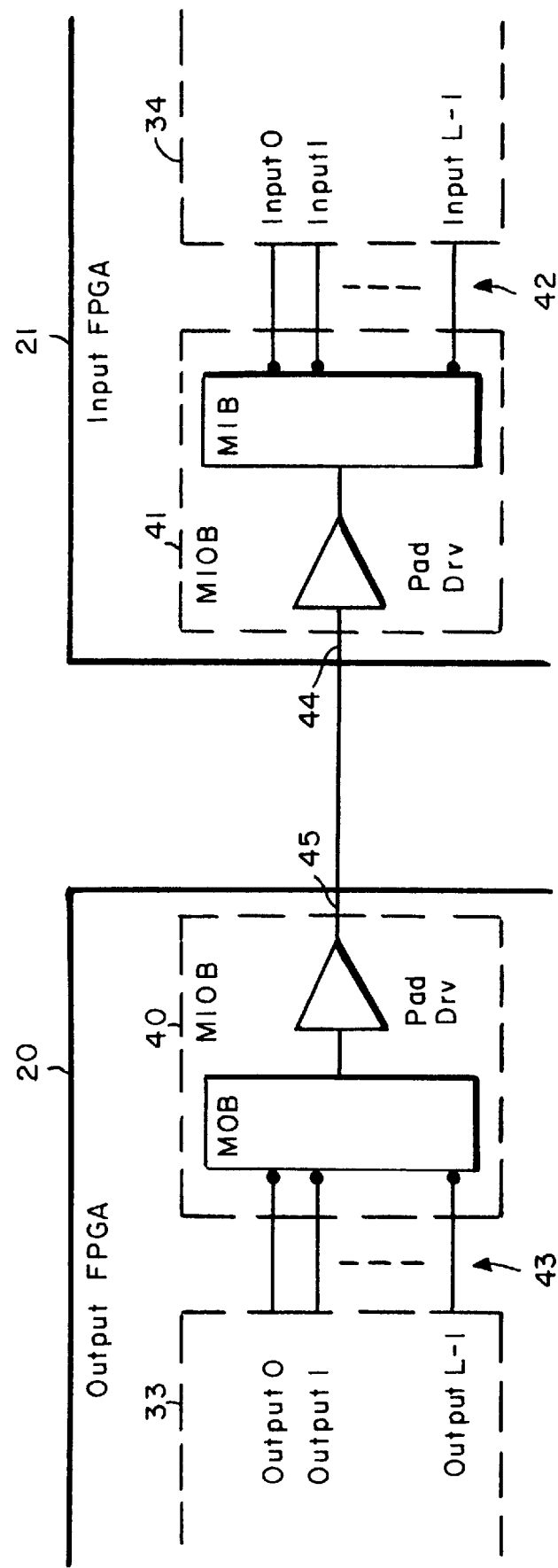
FIG. 4 is a block diagram of a connected MultiPin input buffer and MultiPin output buffer pair of the invention.

With reference to FIG. 4, a MultiPin is connected to a multiplexing input/output buffer (MIOB) 40 and 41 rather than a normal FPGA input/output buffer. An MIOB has an interface to the reprogrammable FPGA array 33 and 34 consisting of a collection of L input ports 42 or L output ports 43, where an input or output port is behaviorally similar to an input or output port of a normal input/output buffer. A connection is achieved by connecting an output MultiPin 45 on one FPGA 20 to an input MultiPin 44 of another FPGA 21.

Figure 5:
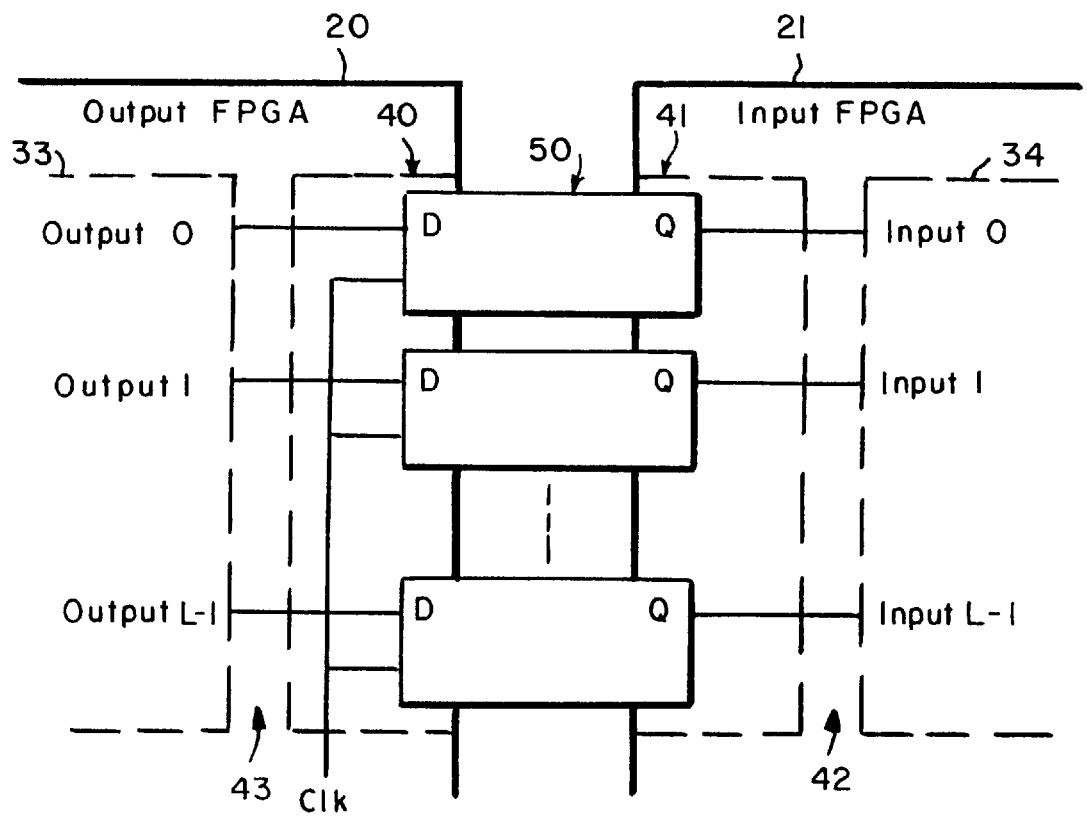
FIG. 5 is a block diagram of the behavioral model of a connected pair of MultiPins of the invention.

The abstract behavioral model of this interconnection, indicated in FIG. 5, is a pair-wise connection of specific output 43 and input 42 ports with flip-flops 50 between the two sets of ports. Note again that this structure with a multiplicity of port pairs is the result of connecting a single pair of MultiPins 40 and 41.

All flip-flops in this construct have the same clock signal. This is the clock used in synchronous logic in the reprogrammable core which connects to the MIOB ports. Timing constraints necessary for correct virtual pins multiplexing behavior can be represented as setup and hold time constraints on the embedded flip-flops in the abstract behavioral model.

The virtue of this model is that it readily maps into an understandable partitioning constraint, either for human or automated partitioning of a design. Partition boundaries should be at the inputs and outputs of flip-flops, which are then subsumed in the virtual pin multiplexing hardware. Whenever this constraint cannot be met, the inter-FPGA signal must use a normal non-multiplexed pin. Circuit techniques such as those described in the pending U.S. patent application Ser. No. 08/042,151, whose teaching are hereby incorporated by reference, can be used to relax this constraint, if desired.

Multiplexing Embodiments

An implementation of the virtual pins multiplexing system contains three hardware structures: a Multiplexing Output Buffer, (MOB); a Multiplexing Input Buffer (MIB); and means for clocking and control signal generation (CTL). A variety of implementations exist for these fundamental hardware structures.

Pin-Multiplexing Embodiment: Level-1

In a Level-1 embodiment of the invention, MIB and MOB multiplexing/demultiplexing buffer structures are implemented directly on FPGAs. The CTL control and clock generation circuitry is implemented externally to the FPGAs. Control signals are distributed to dedicated pins in each FPGA and then internally routed via dedicated low skew paths to the MIB and MOB structures.

The Level-1 embodiment exhibits behavior which is functionally consistent with the virtual pins abstract model. Since CTL is implemented externally to the FPGAs, it can easily operate at speeds in excess of those of the programmable core FPGA logic.

Figure 6:
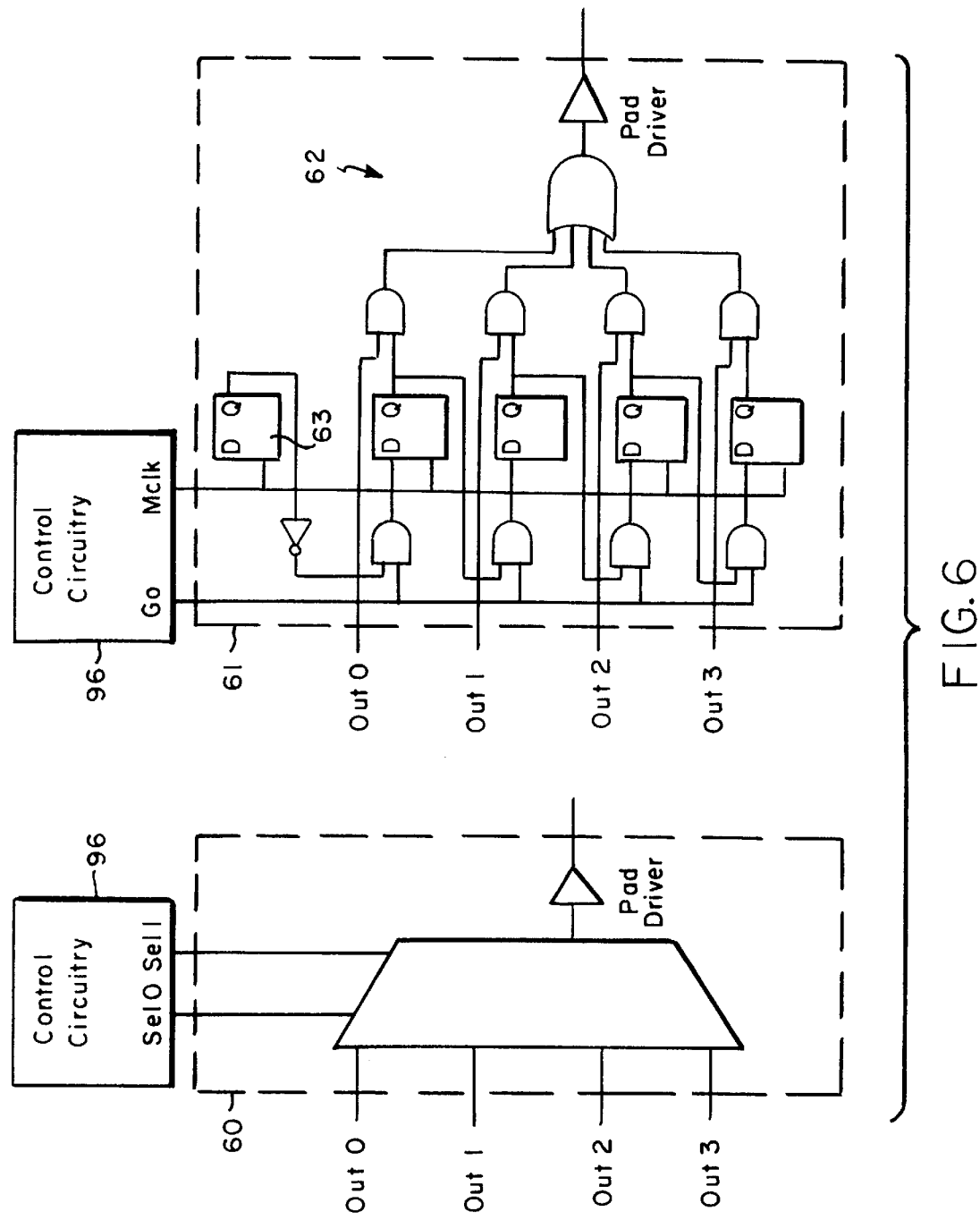
FIG. 6 is a schematic diagram of two MultiPin output buffer embodiments.

FIG. 6 illustrates two circuit diagrams for two forms of MOBs. The first MOB circuit 60 is simply an L:1 multiplexor (where L is the number of multiplexed output signal) whose $Log_2(L)$ select lines are globally distributed from a single source (i.e., control circuitry 96) to all MOBs. The second MOB circuit 61 is an AND-OR multiplexor 62 with a local finite state machine 63 to produce the required multiplexing control signals. This finite state machine 63 requires a globally distributed MClk and Go signal from control circuitry 96 and produces all the needed control signals for any level of multiplexing. FIG. 6 shows a circuit diagrams for each form of MOB for L=4.

Figure 7:
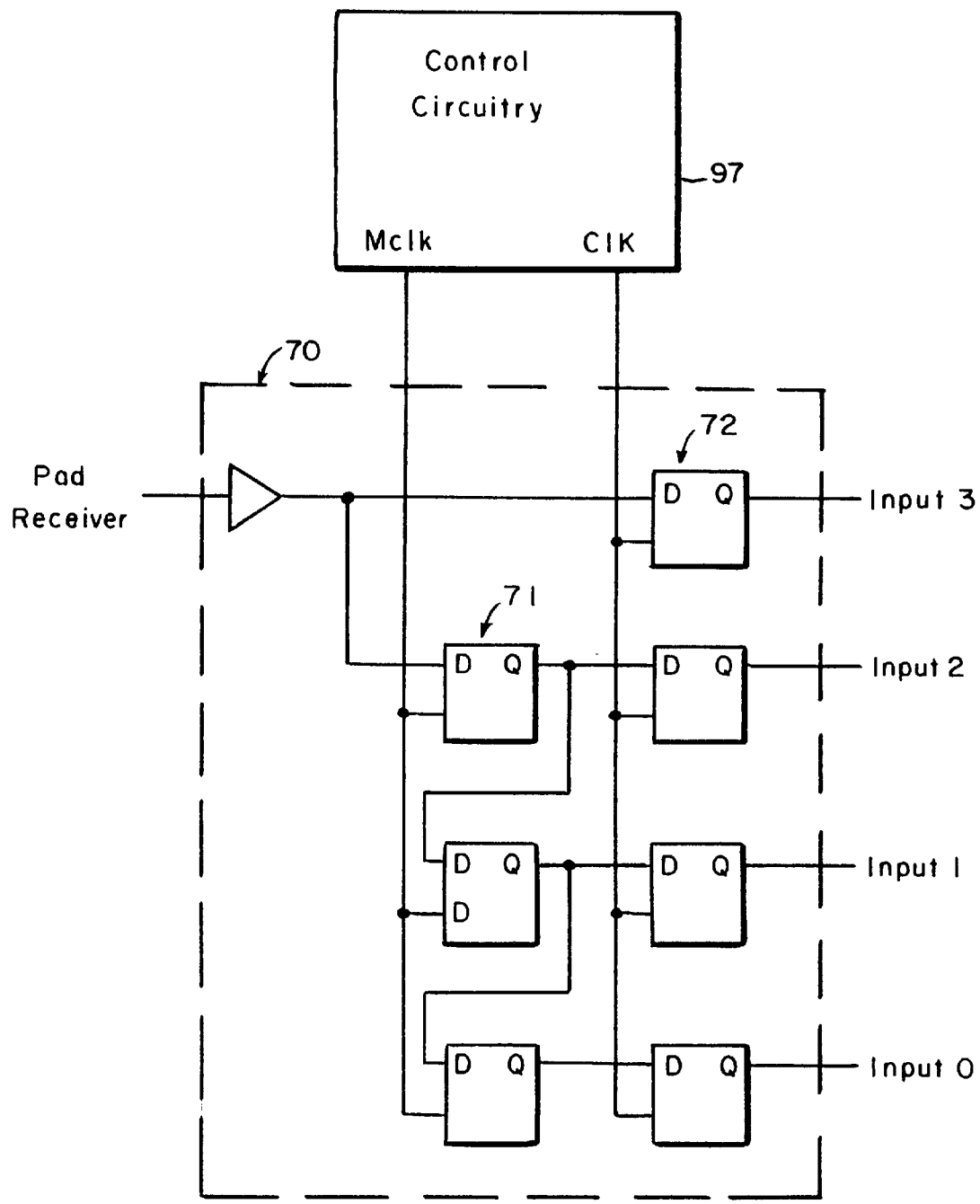
FIG. 7 is a schematic diagram of a MultiPin input buffer.

The MIB is designed to include a bank of registers whose purpose is to cause all multiplexed inputs to become available simultaneously and to remain available for the entire duration of the FPGA core clock Clk. Referring to FIG. 7, a Level-1 MIB 70 consists of a shift-register chain 71 which collects the multiplexed input signals and a bank of registers 72 into which these collected values are transported once per FPGA core clock. Together, the shift-register and flip-flop bank double-buffer the inputs to decouple reading from writing. Notice that the shift-register receives MClk, which is the high speed clock for multiplexed data transmission, whereas the second bank of flip-flops receives, Clk, the FPGA core clock Clk. MCLK and CLK are received from control circuitry 97.

The control circuitry must produce the clock and control signals used by the MOBs and MIBs: Clk, MClk, Sel<i> or Go. Once these signals are produced, either externally or internally to the FPGA, they are routed to all MIOBs via dedicated low-skew paths.

It is assumed for these embodiments that the basic clock signal Clk, which is the clock of the flip-flops in the abstract model and the clock used by synchronous core logic connected to the MultiPin ports, is always received on a dedicated FPGA input pin and routed to all MIOBs on the FPGA with low skew. It is also assumed that the signals MClk and Go are externally produced. If the MOB using a multiplexor without local control is used, a finite state machine is required to produce the appropriate Sel<i> signals, triggered by Go. Several acceptable forms for this FSM, all counters of various sorts, should be evident to one skilled in the art.

Figure 8:
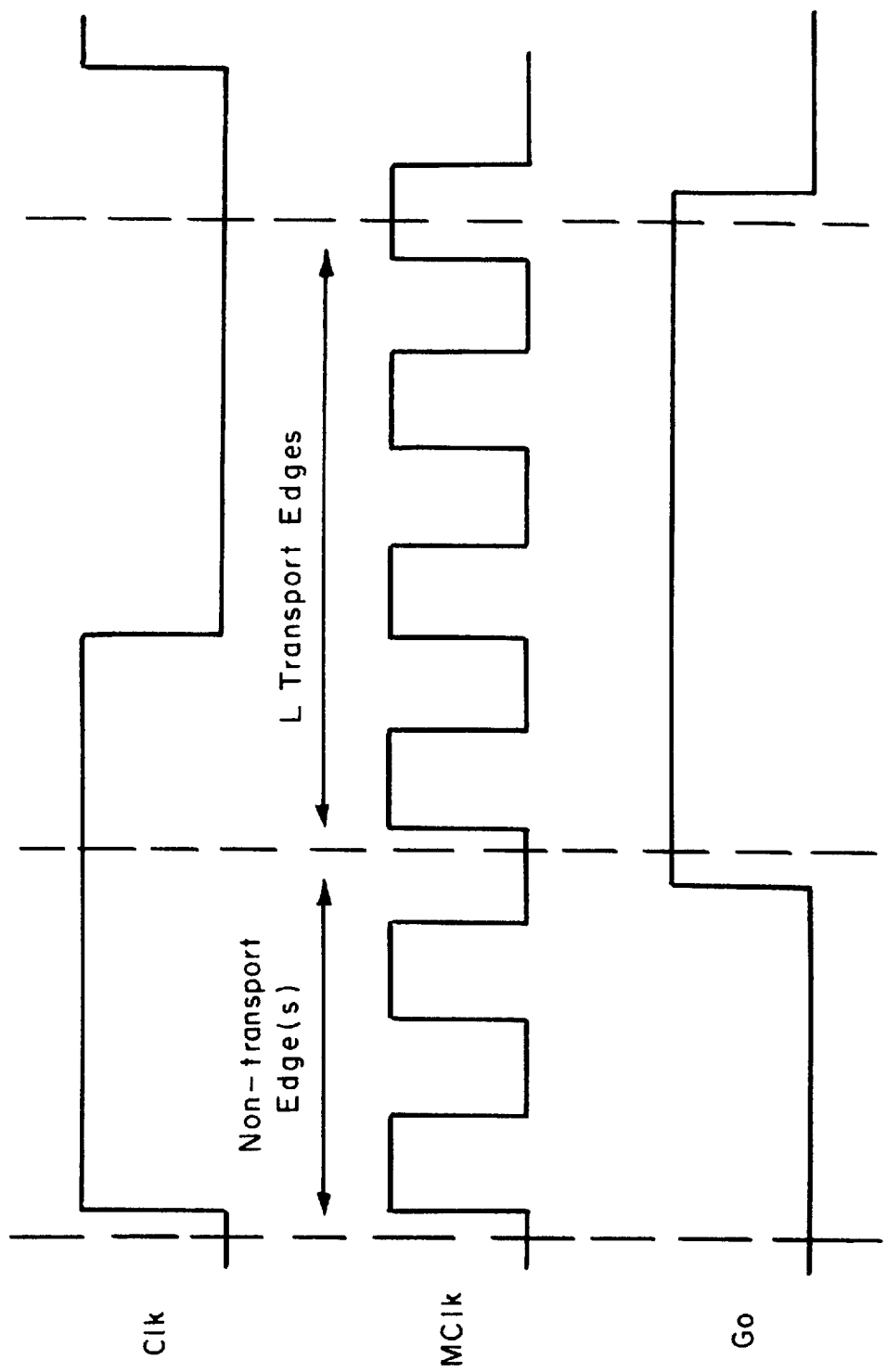
FIG. 8 is a timing diagram showing the relationship between the clock and control signals.

The timing diagram in FIG. 8 indicates the minimal set of timing constraints which must be satisfied by Clk, MClk and Go. Within each period of Clk, MClk must have at least L+1 rising edges. The last L consecutive rising edges of MClk are used to drive data over the pin and are referred to as transport edges. One or more additional non-transport edges are also required. It is legitimate for the first non-transport edge in MClk to coincide with the rising edge of Clk, however if this is the case then the edges must be synchronized, (i.e. a non-transport edge in MClk cannot precede Clk). The time from the last transport edge to the rising edge of Clk must be at least the period of MClk.

Go must be asserted prior to the first transport edge and must remain high for all transport edges. It must be deasserted prior to the first non-transport edge and must remain low for all edges.

MClk can have as many non-transport edges as is desired with a minimum of 1. The reason for allowing multiple transport edges is that outgoing data from the FPGA core must achieve a setup time to the first transport edge. In order to avoid constraining the period of MClk as a result of core FPGA speeds, we allow multiple MClk periods for core FPGA computation, followed by data transmission at 1-bit per MClk edge. (One can achieve the same effect with only one non-transport edge by using an MClk with non-constant period.)

Timing constraints on the period of MClk are that it must include the propagation delay of the output FPGA control circuit, MOB multiplexor, output pad driver, input pad receiver and the setup time of the sampling MIB flip-flop, plus any clock skew between MClk on the two FPGAs.

Note that if fewer than the L-way multiplexing supported by the hardware is needed, the MOB and MIB circuits illustrated above support any number fewer than L by using fewer transport edges and not using the last one or more MultiPin port pairs.

In contrast to methods which utilize core FPGA logic for multiplexing and control, dedicated hardware offers a speed improvement in comparison to reprogrammable logic by decoupling communication bandwidth from core clock speeds. Dedicated hardware avoids the need for a user to design or synthesize multiplexing circuitry. Finally, dedicated hardware frees up reprogrammable logic which can then be utilized for the logic partition.

Pin-Multiplexing Embodiment: Level-2

Level-2 extends Level-1 by incorporating the CTL submodule directly in dedicated hardware on the FPGA. The FPGA CTL circuitry must generate MClk and Go signals directly from the core clock signal Clk. The Level-2 CTL submodule comprises a phase-locked loop or other type of clock multiplier circuit which produces MClk as some fixed or selectable synchronized multiple of Clk and produces Go setup to a fixed or selectable MClk edge.

If the clock-multiplier is fixed then a prespecified number of transport and non-transport edges of MClk will exist. This will give less flexibility in optimizing the timing of circuits but eliminates complexity in the clock-multiplier circuitry.

Skew-Tolerance

Hold time considerations for the sampling flip-flops in the MIB lead to skew restrictions on the distribution systems for Clk and MClk between the communicating FPGAs. The MClk received by flip-flops on two distinct FPGAs must have skew no greater than the hold time of the sampling flip-flops in the MIB.

Figure 9:
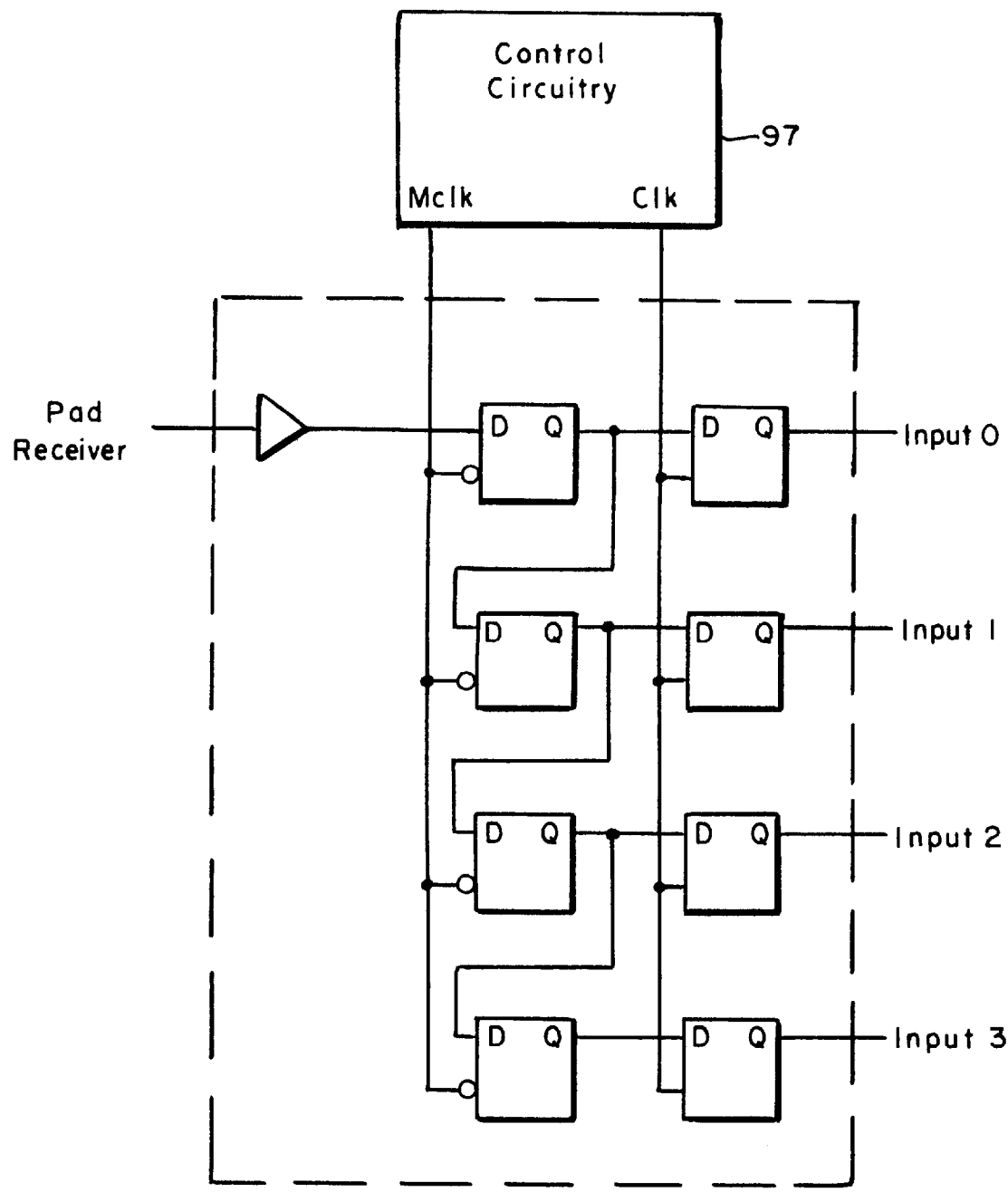
FIG. 9 is a schematic diagram of a skew tolerant MultiPin input buffer.

A slight variation of the design of MIBs leads to a skew tolerant system, at a cost in communication speed. A schematic of the resulting circuit is provided as FIG. 9. One extra sampling flip-flop has been added to the shift-register and the entire shift-register has been implemented using negative edge triggered flip-flops. With this design, the input signal changes synchronously with rising MClk edges and is sampled on falling edges.

In this design, the period of MClk in the Level-1 section must now be the interval between a rising and falling edge of MClk. Time between falling and rising edges provides controllable hold time margins in the face of MClk skew between the two FPGAs.

Latch based circuitry

Figure 10:
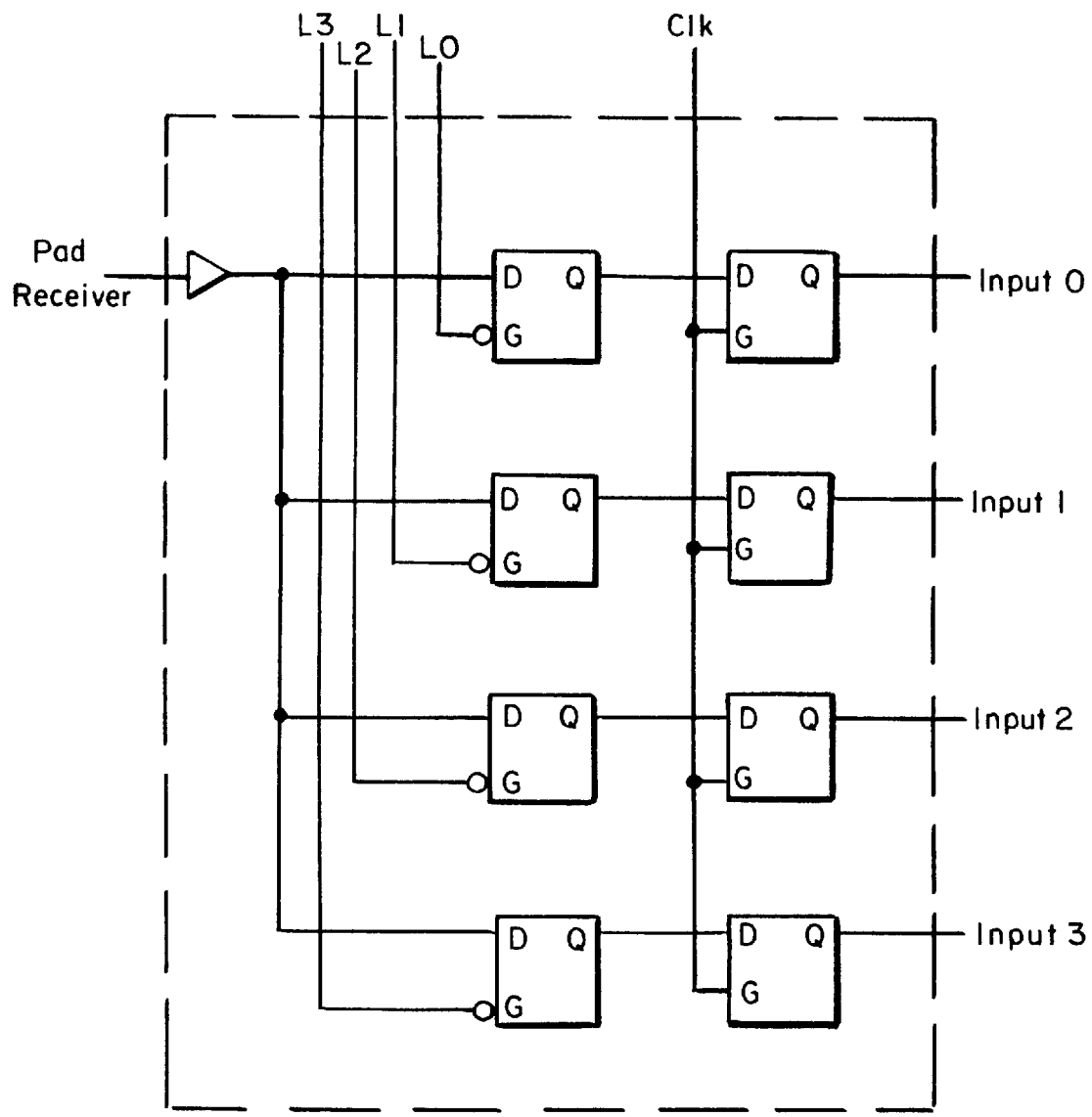
FIG. 10 is a schematic diagram of a latch based MultiPin input buffer.

On the input side, the use of edge-triggered master-slave flip-flops rather than latches increases the per-MultiPin hardware cost by about a factor of 2. FIG. 10 illustrates the latch-based MIB. This approach adds some hardware complexity and cost to the control and control-signal distribution circuitry in exchange for a savings in each MIB. Since an FPGA has many MIBs and only a single CTL module, the cost savings accrued over multiple MIBs can outweigh the added CTL cost.

Figure 11:
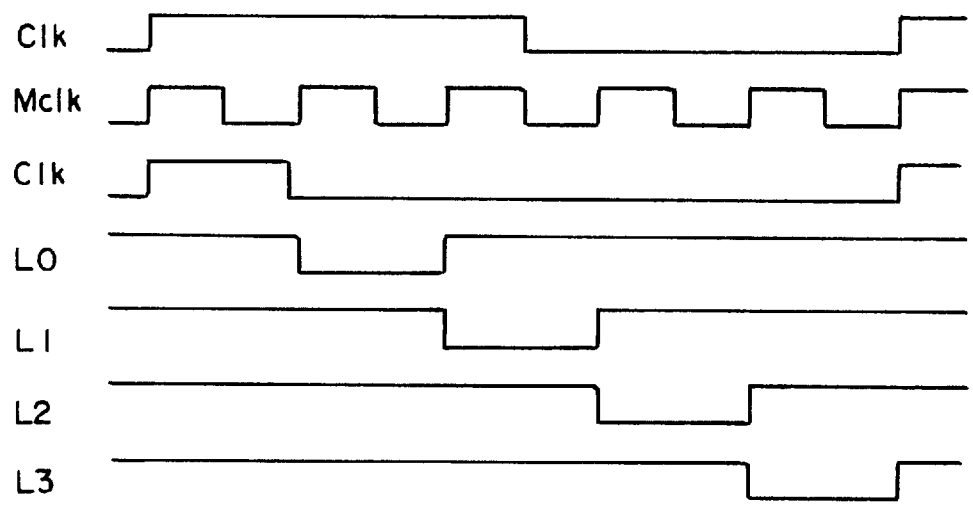
FIG. 11 is a timing diagram showing the relationship between the clock and select control signals.

Referring to FIG. 10, the control signals are all latching strobes. Clk' is a version of Clk with the same rising edge but with a falling edge which precedes the falling edge of L0. L0 .. L3 are negative active latching strobes whose rising edges must be coincident with transition edges 1 through 3 of MClk (where the initial transition edge is numbered 0), plus a non-transition edge coincident with the rising edge of Clk. FIG. 11 illustrates the timing constraints on Clk, MClk, Clk', L0, L1, L2 and L3.

Pipelining

In the embodiments described above, the critical path dictating the period of Clk may involve logic in the programmable core followed by the extended setup-time associated with the traversal of a MultiPin.

One might choose to add a bank of registers clocked by CLK prior to the multiplexor in the MOB. (A functionally equivalent implementation involves a shift-register which can be parallel-loaded on edges in CLK and shifted on edges in MClk, avoiding the need for multiplexing.) With either modification, there is no unregistered path that involves both core FPGA logic and MultiPin transport.

This change impacts the behavioral model, replacing each abstract flip-flop by a pair of flip-flops. Stated differently, it adds an additional stage of pipeline delay on the communication path.

Bidirectional Pins

Figure 12:
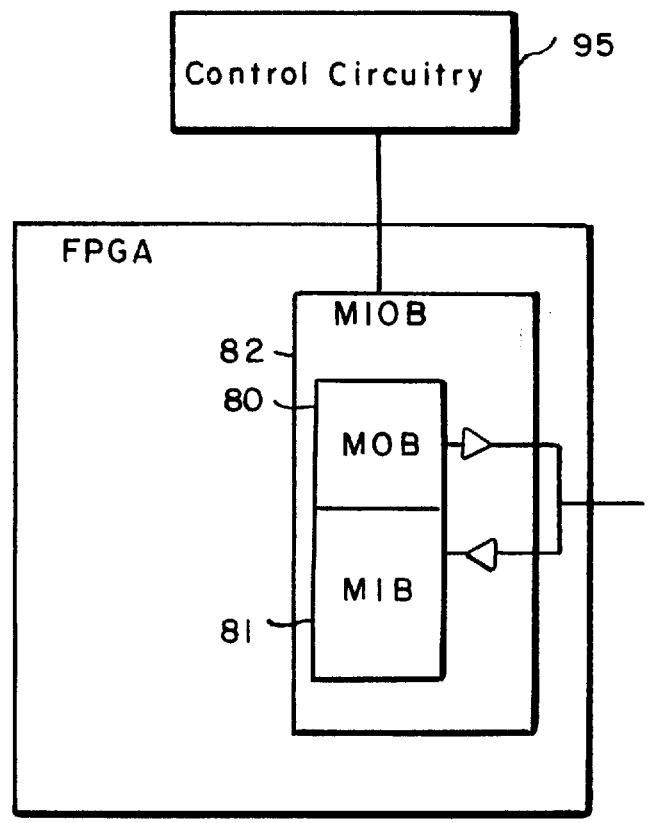
FIG. 12 is a block diagram of a Multipin input buffer and Multipin output buffer on an FPGA.

The discussion above describes unidirectional, either MOB or MIB MultiPins. A bidirectional structure can be supported with the addition of a tri-state driver and the inclusion of both an MOB 80 and MIB 81 into a single MIOB 82 as illustrated in FIG. 12. MIOB 82 is controlled by control signals received from control circuitry 95. These control signals correspond to those shown in FIGS. 6 and 7.

Multiplexed vs. Non-multiplexed Pin Tradeoffs

Multiplexing pins using the present invention can be mixed freely on an FPGA with non-multiplexing pins in any ration that is desired. In addition, the hardware for a non-multiplexed input/output buffer and a MIOB can be merged into a single aggregate structure that can act as either a MultiPin or a normal pin. The mode of operation of this structure is programmatically selectable using the programming mechanism of the core logic array.

It is to be understood that the above description is only of one preferred embodiment of the invention. Numerous other arrangements may be devised by one skilled in the art without departing from the scope of the invention. The invention is thus limited only as defined in the claims.

What is claimed is:

1. A programmable logic circuit having a programmable logic array which generates a plurality of output signals for output from a single port on the programmable logic circuit, and which processes a plurality of input signals received from a single port on the programmable logic circuit, the programmable logic circuit comprising:

multiplexing means for receiving the plurality of output signals generated by the programmable logic array and for multiplexing said plurality of output signals;

an output port for outputting from the programmable logic circuit, the multiplexed plurality of output signals generated by the programmable logic array;

an input port for receiving a multiplexed plurality of input signals; and demultiplexing means for demultiplexing said multiplexed plurality of input signals, and for configurably communicating said demultiplexed plurality of input signals to the programmable logic array;

wherein the programmable logic array is operable at a first clock speed and wherein the multiplexing means and the demultiplexing means are each operable at a clock speed which is different from the first clock speed.

2. A programmable logic circuit according to claim 1, further comprising a pin electrically coupled to said output port and a pin electrically coupled to said input port.

3. A programmable logic circuit according to claim 2, further comprising means for outputting a select signal to select one of said output port or said input port.

4. A programmable logic circuit according to claim 1, further comprising multiplexing control means for controlling said multiplexing means to operate at a clock speed which is greater than the first clock speed.

5. A programmable logic circuit according to claim 1, further comprising demultiplexing control means for controlling said demultiplexing means to operate at a clock speed which is greater than the first clock speed.

6. A programmable logic circuit according to claim 2 or 3, further comprising:

multiplexing control means for controlling said multiplexing means to operate at a clock speed which is greater than the first clock speed; and demultiplexing control means for controlling said demultiplexing means to operate at a clock speed which is greater than the first clock speed.

7. A programmable logic circuit according to claim 4 or 5, wherein said multiplexing control means and said demultiplexing control means are external to said programmable logic array.

8. A programmable logic circuit according to claim 6, wherein said multiplexing control means and said demultiplexing control means are external to said programmable logic array.

9. A programmable logic circuit according to claim 1, wherein said multiplexing means comprises at least one flip-flop.

10. A programmable logic circuit according to claim 1, wherein said multiplexing means comprises at least one latch.

11. A programmable logic circuit according to claim 3, wherein said demultiplexing means comprises a shift register.

12. A programmable logic circuit according to claim 1 or 2, wherein the programmable logic array in said programmable logic circuit is reconfigurable.

13. A programmable logic circuit according to claim 6, wherein the programmable logic array in said programmable logic circuit is reconfigurable.

14. A programmable logic circuit according to claim 4 or 5, wherein said programmable logic circuit is an FPGA.

15. A programmable logic circuit according to claim 6, wherein said programmable logic circuit is an FPGA.

16. A programmable logic circuit according to claim 15, wherein said multiplexing control means and said demultiplexing control means are each comprised of programmable logic.

17. A method of inputting and outputting a plurality of signals from a programmable logic circuit which includes a programmable logic array that generates a plurality of output signals and that processes a plurality of input signals, the method comprising the steps of:

multiplexing the plurality of output signals generated by the programmable logic array;

outputting the multiplexed plurality of output signals from the programmable logic circuit;

receiving a multiplexed plurality of input signals at the programmable logic circuit;

demultiplexing the multiplexed plurality of input signals; and communicating the demultiplexed plurality of input signals to the programmable logic array;

wherein the programmable logic array is operable at a first clock speed and wherein the multiplexing steps and the demultiplexing steps are each performed at a clock speed which is different from the first clock speed.

18. A method according to claim 17, wherein the programmable logic circuit includes a single input port for receiving the multiplexed plurality of input signals and a single output port for outputting the multiplexed plurality of output signals.

19. A method according to claim 18, further comprising the step of outputting a select signal to select one of the output port or the input port.

20. A method according to claim 17, further comprising the step of controlling the multiplexing step to operate at a clock speed which is greater than the first clock speed.

21. A method according to claim 17, further comprising the step of controlling the demultiplexing step to operate at a clock speed which is greater than the first clock speed.

22. A method according to claim 18 or 19, further comprising the steps of:

controlling the multiplexing step to operate at a clock speed which is greater than the first clock speed; and controlling the demultiplexing step to operate at a clock speed which is greater than the first clock speed.

23. A method according to claim 20 or 21, wherein the multiplexing step is performed by a multiplexing means which is controlled by a control means that is external to the programmable logic array, and the demultiplexing step is performed by a demultiplexing means which is controlled by a control means that is external to the programmable logic array.

24. A method according to claim 22, wherein the multiplexing step is performed by a multiplexing means which is controlled by a control means that is external to the programmable logic array, and the demultiplexing step is performed by a demultiplexing means which is controlled by a control means that is external to the programmable logic array.

25. A method according to claim 24, wherein the multiplexing means comprises at least one flip-flop.

26. A method according to claim 24, wherein the multiplexing means comprises at least one latch.

27. A method according to claim 24, wherein the demultiplexing means comprises a shift register.

28. A method according to claim 17 or 18, further comprising the step of reconfiguring the programmable logic array in the programmable logic circuit to affect generation of the output signals or processing of the input signals.

29. A method according to claim 22, further comprising the step of reconfiguring the programmable logic array in the programmable logic circuit to affect generation of the output signals or processing of the input signals.

30. A method according to claim 20 or 21, wherein the programmable logic circuit is an FPGA.

31. A method according to claim 22, wherein the programmable logic circuit is an FPGA.

* * * * *